(12) United States Patent
Peng et al.

(10) Patent No.: US 11,086,349 B2
(45) Date of Patent: Aug. 10, 2021

(54) REFERENCE VOLTAGE GENERATOR CAPABLE OF REDUCING HOT CARRIER STRESS

(71) Applicant: eMemory Technology Inc., Hsin-Chu (TW)

(72) Inventors: Jen-Yu Peng, Hsinchu County (TW); Chun-Hung Lin, Hsinchu County (TW); Cheng-Da Huang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 16/558,144

(22) Filed: Sep. 1, 2019

(65) Prior Publication Data

US 2020/0159273 A1 May 21, 2020

Related U.S. Application Data

(60) Provisional application No. 62/768,099, filed on Nov. 16, 2018.

(51) Int. Cl.
*G05F 3/30* (2006.01)
*G11C 11/56* (2006.01)
(Continued)

(52) U.S. Cl.
CPC ............... *G05F 3/30* (2013.01); *G05F 3/22* (2013.01); *G11C 5/147* (2013.01);
(Continued)

(58) Field of Classification Search
CPC ... G05F 1/10; G05F 1/46; G05F 1/468; G05F 1/562; G05F 1/569; G05F 1/571; G05F 1/613; G05F 3/02; G05F 3/08; G05F 3/24; G05F 3/247; G05F 3/30; G11C 11/5642; G11C 16/0408; G11C 16/10; G11C 16/26; G11C 16/3459; G11C 16/14;
(Continued)

(56) References Cited

U.S. PATENT DOCUMENTS

| 5,132,936 A | 7/1992 | Keswick |
| 5,369,312 A | 11/1994 | Oh |

(Continued)

FOREIGN PATENT DOCUMENTS

| CN | 1725381 A | 1/2006 |
| CN | 101515476 A | 8/2009 |

(Continued)

*Primary Examiner* — Gustavo A Rosario-Benitez
(74) *Attorney, Agent, or Firm* — Winston Hsu

(57) ABSTRACT

A reference voltage generator includes an output terminal, a current source, a reference circuit, a protection circuit, and a control circuit. The output terminal outputs a reference voltage. The current source is coupled to the output terminal, and generates a reference current. The reference circuit is coupled to the output terminal, and generates a reference voltage according to the reference current. The protection circuit is coupled to the output terminal, and adjusts a voltage of the output terminal to an operating voltage. The control circuit is coupled to the reference circuit and the protection circuit. The control circuit controls the reference circuit and the protection circuit according to a start signal.

4 Claims, 4 Drawing Sheets

(51) Int. Cl.
| | |
|---|---|
| *G11C 5/14* | (2006.01) |
| *G11C 16/30* | (2006.01) |
| *G11C 16/24* | (2006.01) |
| *G11C 16/28* | (2006.01) |
| *G11C 16/08* | (2006.01) |
| *G11C 16/04* | (2006.01) |
| *G11C 16/10* | (2006.01) |
| *G11C 16/26* | (2006.01) |
| *G11C 16/34* | (2006.01) |
| *G05F 3/22* | (2006.01) |
| *G11C 16/14* | (2006.01) |
| *H01L 27/02* | (2006.01) |
| *H01L 27/11524* | (2017.01) |

(52) U.S. Cl.
CPC ...... *G11C 11/5642* (2013.01); *G11C 16/0408* (2013.01); *G11C 16/0433* (2013.01); *G11C 16/08* (2013.01); *G11C 16/10* (2013.01); *G11C 16/14* (2013.01); *G11C 16/24* (2013.01); *G11C 16/26* (2013.01); *G11C 16/28* (2013.01); *G11C 16/30* (2013.01); *G11C 16/3445* (2013.01); *G11C 16/3459* (2013.01); *H01L 27/0207* (2013.01); *H01L 27/11524* (2013.01)

(58) Field of Classification Search
CPC . G11C 16/3445; G11C 16/0433; G11C 5/147; G11C 16/30; G11C 16/24; G11C 16/28; G11C 16/08; G11C 7/065
See application file for complete search history.

(56) References Cited

U.S. PATENT DOCUMENTS

| | | | | |
|---|---|---|---|---|
| 6,016,050 | A * | 1/2000 | Brokaw | G05F 3/205 |
| | | | | 323/315 |
| 6,400,212 | B1 | 6/2002 | Sakurai | |
| 6,584,019 | B1 * | 6/2003 | Chevallier | G11C 11/5621 |
| | | | | 365/185.29 |
| 7,342,390 | B2 | 3/2008 | Tachibana | |
| 9,153,335 | B2 * | 10/2015 | Murakami | G11C 16/24 |
| 9,189,007 | B2 | 11/2015 | Ko | |
| 9,618,959 | B2 | 4/2017 | Ambundo | |
| 9,720,435 | B2 | 8/2017 | Joffe | |
| 10,062,448 | B1 * | 8/2018 | Torres | G11C 17/18 |
| 2002/0033720 | A1 * | 3/2002 | Ikehashi | G11C 5/143 |
| | | | | 327/143 |
| 2003/0057931 | A1 * | 3/2003 | Di Iorio | G11C 16/30 |
| | | | | 323/313 |
| 2005/0286305 | A1 | 12/2005 | O | |
| 2006/0114054 | A1 * | 6/2006 | Giduturi | G11C 16/30 |
| | | | | 327/543 |
| 2006/0132114 | A1 * | 6/2006 | Giduturi | G11C 16/30 |
| | | | | 323/313 |
| 2007/0052405 | A1 * | 3/2007 | Mochizuki | G05F 3/30 |
| | | | | 323/316 |
| 2008/0106965 | A1 * | 5/2008 | Hirobe | G11C 8/08 |
| | | | | 365/226 |
| 2008/0239837 | A1 * | 10/2008 | Kumazaki | G11C 5/147 |
| | | | | 365/189.09 |
| 2009/0016106 | A1 * | 1/2009 | Tran | G11C 16/28 |
| | | | | 365/185.05 |
| 2009/0033355 | A1 | 2/2009 | Hsu | |
| 2009/0146624 | A1 * | 6/2009 | Kim | G05F 1/613 |
| | | | | 323/271 |
| 2009/0213665 | A1 | 8/2009 | Utsunomiya | |
| 2009/0256625 | A1 | 10/2009 | Jung | |
| 2009/0257288 | A1 * | 10/2009 | Roohparvar | G11C 16/24 |
| | | | | 365/189.09 |
| 2010/0052636 | A1 * | 3/2010 | Takagi | G05F 1/56 |
| | | | | 323/281 |
| 2011/0234289 | A1 | 9/2011 | Subramanian | |
| 2013/0154605 | A1 * | 6/2013 | Nagata | G05F 3/02 |
| | | | | 323/313 |
| 2013/0335043 | A1 * | 12/2013 | He | H02M 3/04 |
| | | | | 323/234 |
| 2014/0077788 | A1 * | 3/2014 | Vemula | G05F 1/613 |
| | | | | 323/313 |
| 2015/0234413 | A1 * | 8/2015 | Al-Shyoukh | G05F 3/24 |
| | | | | 323/313 |
| 2015/0255162 | A1 * | 9/2015 | Shibazaki | G11C 5/06 |
| | | | | 365/185.05 |
| 2017/0178745 | A1 * | 6/2017 | Chen | G11C 17/18 |
| 2018/0268898 | A1 | 9/2018 | Suzuki | |
| 2018/0323780 | A1 | 11/2018 | Chen | |

FOREIGN PATENT DOCUMENTS

| | | |
|---|---|---|
| CN | 100570527 C | 12/2009 |
| CN | 101594137 A | 12/2009 |
| CN | 102375470 A | 3/2012 |
| CN | 103117080 A | 5/2013 |
| CN | 103117741 A | 5/2013 |
| CN | 203135827 U | 8/2013 |
| CN | 103595024 A | 2/2014 |
| CN | 203786597 U | 8/2014 |
| CN | 104571241 A | 4/2015 |
| CN | 104850161 A | 8/2015 |
| CN | 104979000 A | 10/2015 |
| CN | 108630270 A | 10/2018 |
| TW | 574782 | 2/2004 |
| TW | 200812246 | 3/2008 |
| TW | 201243534 A1 | 11/2012 |
| WO | 03049289 | 6/2003 |
| WO | 2014/101837 A1 | 7/2014 |

\* cited by examiner

REFERENCE VOLTAGE GENERATOR CAPABLE OF REDUCING HOT CARRIER STRESS

CROSS REFERENCE TO RELATED APPLICATIONS

This non-provisional application claims priority of US provisional application No. 62/768,099, filed on Nov. 16, 2018, included herein by reference in its entirety.

BACKGROUND OF THE INVENTION

1. Field of the Invention

The present invention is related to a reference voltage generator, and more particularly, to a reference voltage generator capable of reducing hot carrier stress.

2. Description of the Prior Art

A non-volatile memory is a type of memory that retains information it stores even when no power is supplied to memory blocks. For example, the non-volatile memory cell may include a varactor. The non-volatile memory cell can be programmed by applying a high voltage to rupture the varactor. Since the resistance of the varactor will be lowered after being ruptured, the reading current generated by the programmed non-volatile memory cell would be greater than the reading current generated by the non-volatile memory cell not being programmed. In this case, to determine the non-volatile memory cell to be programmed or non-programmed, a reference current may be used to compare with the reading current generated by the non-volatile memory cell.

In prior art, the reference current and the reading current can be converted to voltage signals, so the sense amplifier can be used to compare the voltages easily. However, during the conversion, the hot carrier stress may shift the reference voltage corresponding to the reference current, resulting in wrong reading results.

SUMMARY OF THE INVENTION

One embodiment of the present invention discloses a reference voltage generator. The reference voltage generator includes an output terminal, a current source, a reference circuit, a protection circuit, and a control circuit.

The output terminal outputs a reference voltage. The current source is coupled to the output terminal, and generates a reference current. The reference circuit is coupled to the output terminal, and generates a reference voltage according to the reference current. The protection circuit is coupled to the output terminal, and adjusts a voltage of the output terminal to an operating voltage. The control circuit is coupled to the reference circuit and the protection circuit. The control circuit controls the reference circuit and the protection circuit according to a start signal.

Another embodiment of the present invention discloses a method for operating a reference voltage generator. The reference voltage generator includes a current source, a reference circuit, and a protection circuit.

The method includes enabling the current source to generate a reference current to an output terminal, enabling the protection circuit to adjust a voltage of the output terminal to an operating voltage, enabling the reference circuit to output a reference voltage through the output terminal according to the reference current, and disabling the protection circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
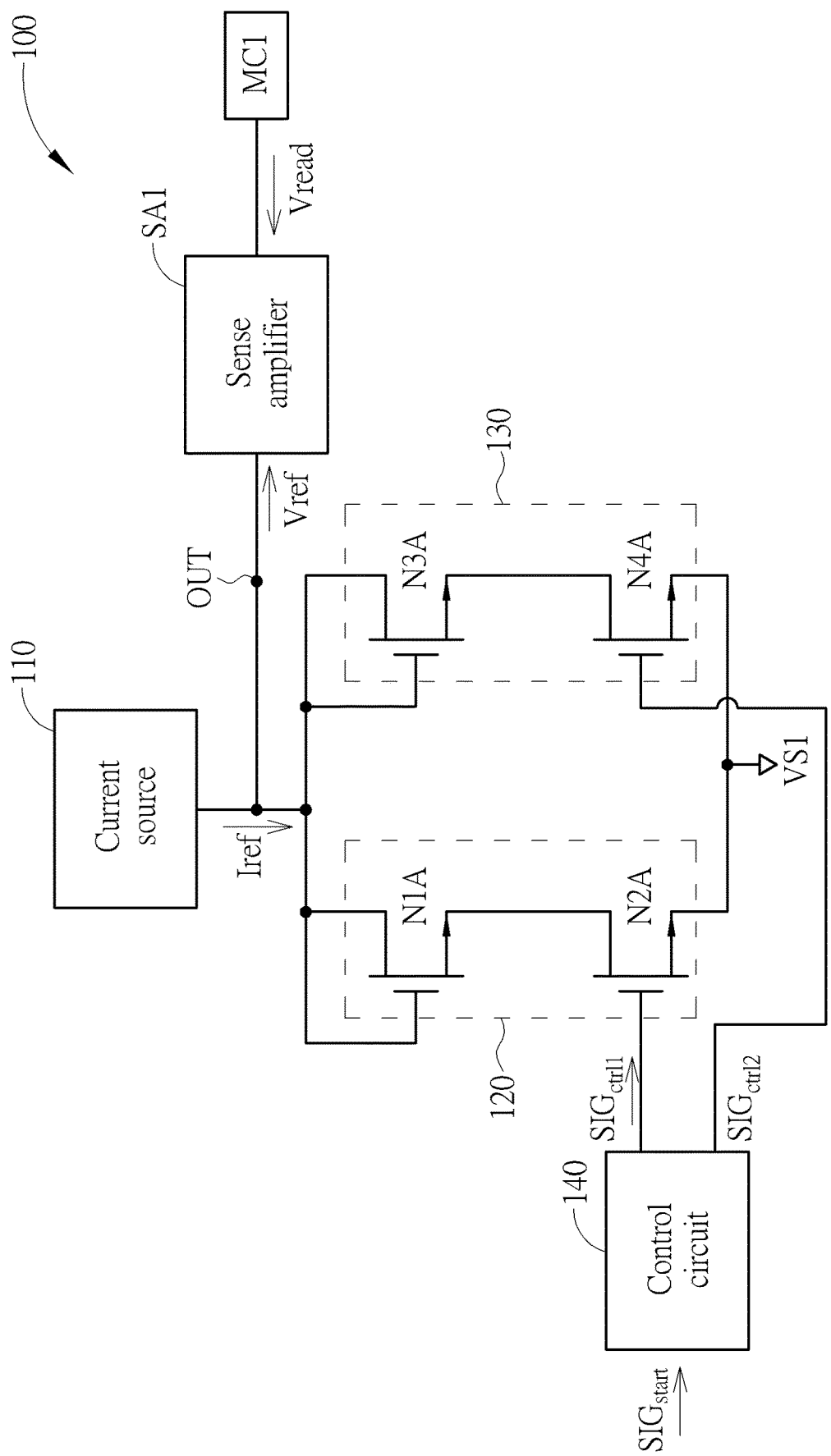
FIG. 1 shows a reference voltage generator according to one embodiment of the present invention.

FIG. 1 shows a reference voltage generator 100 according to one embodiment of the present invention. The reference voltage generator 100 includes an output terminal OUT, a current source 110, a reference circuit 120, a protection circuit 130, and a control circuit 140.

The current source 110 is coupled to the output terminal OUT, and can generate a reference current $I_{ref}$. The reference circuit 120 is coupled to the output terminal OUT. In FIG. 1, the reference circuit 120 includes N-type transistors N1A and N2A. The N-type transistor N1A has a first terminal coupled to the output terminal OUT, a second terminal, and a control terminal coupled to the first terminal of the N-type transistor N1A. The N-type transistor N2A has a first terminal coupled to the second terminal of the N-type transistor N1A, a second terminal for receiving a system voltage VS1, and a control terminal coupled to a first output terminal of the control circuit 140. The reference circuit 120 can generate a reference voltage $V_{ref}$ according to the reference current $I_{ref}$, and output the reference voltage $V_{ref}$ through the output terminal OUT.

In FIG. 1, the output terminal OUT can be coupled to a sense amplifier SA1, and the sense amplifier SA1 can compare the reference voltage $V_{ref}$ and a reading voltage $V_{read}$. In some embodiments, the reading voltage $V_{read}$ can be generated according to a reading current generated by the memory cell MC1. That is, the reference voltage $V_{ref}$ and the reading voltage $V_{read}$ can be designated to represent the reference current $I_{ref}$ and the reading current generated by the memory cell MC1. In some embodiments, the reference current $I_{ref}$ generated by the current source 110 can be determined according to the characteristics of the memory cell MC1, therefore, the comparing result obtained by the sense amplifier SA1 can be used to indicate the programming state of the memory cell MC1. For example, if the reference voltage $V_{ref}$ is greater than the reading voltage $V_{read}$, it may imply that the memory cell MC1 has not been programmed. Otherwise, if the reference voltage $V_{ref}$ is smaller than the reading voltage, it may imply that the memory cell MC1 has been programmed. However, in some other embodiments, the reference voltage generator 100 can be adopted in other application according to the system requirement. Also, in another embodiment, the sense amplifier SA1 may compare the reading current generated by the memory cell MC1 and the reference current $I_{ref}$ to determine the programming state of the memory cell MC1.

In some embodiments, the voltage of the output terminal OUT may be raised to a high level during the operations. In this case, when the reference circuit 120 is enabled to generate the reference voltage $V_{ref}$, the N-type transistor N1A of the reference circuit 120 may endure the hot carrier stress, and the reference voltage $V_{ref}$ may be shifted to a higher level than expected, causing errors to the system.

In this case, the protection circuit 130 can be used to reduce the hot carrier stress. In FIG. 1, the protection circuit 130 can be coupled to the output terminal OUT, and can adjust the voltage of the output terminal OUT to an operating voltage $V_{OPT}$ before the reference circuit 120 is enabled.

The protection circuit 130 includes N-type transistors N3A and N4A. The N-type transistor N3A has a first terminal coupled to the output terminal OUT, a second terminal, and a control terminal coupled to the first terminal of the N-type transistor N3A. The N-type transistor N4A has a first terminal coupled to the second terminal of the N-type transistor N3A, a second terminal for receiving the system voltage VS1, and a control terminal coupled to a second output terminal of the control circuit 140.

In some embodiments, the control circuit 140 can be coupled to the reference circuit 120 and the protection circuit 130. In FIG. 1, the control circuit 140 can generate control signals $SIG_{ctrl1}$ and $SIG_{ctrl2}$ through two output terminals for controlling the reference circuit 120 and the protection circuit 130 respectively.

Figure 2:
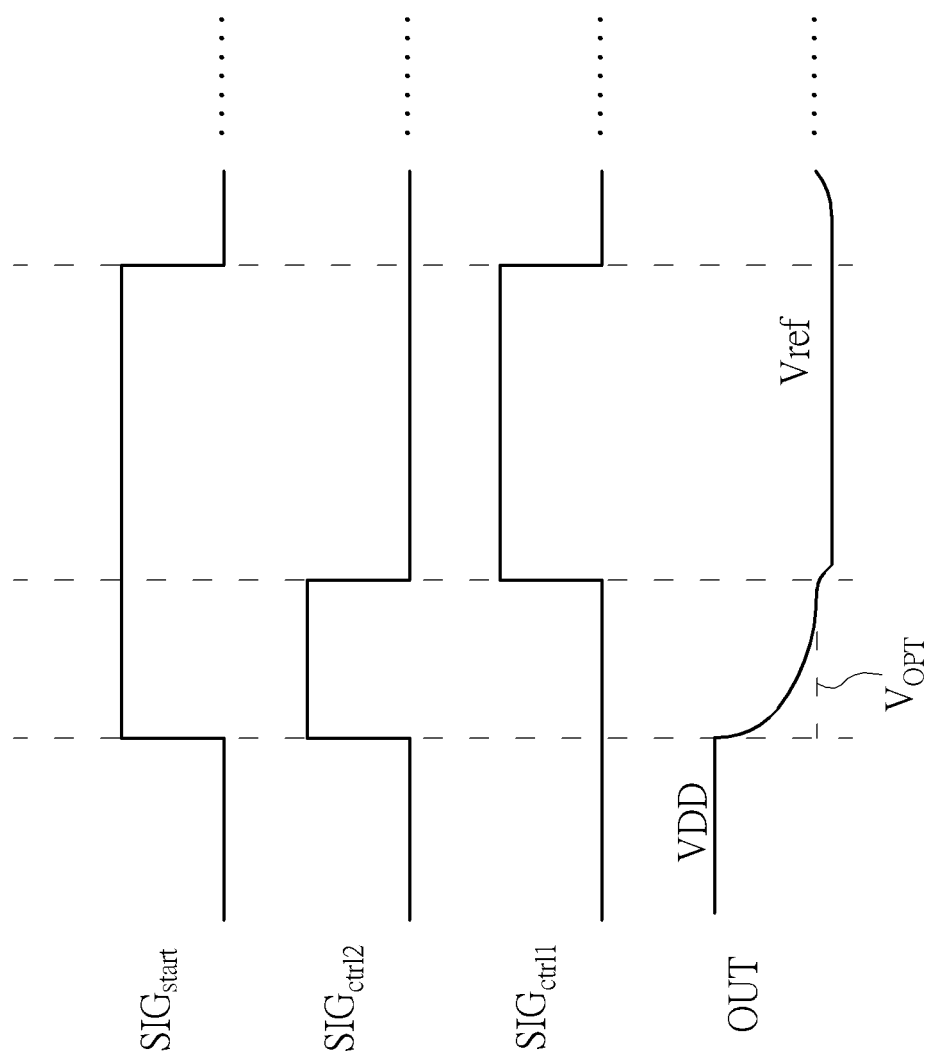
FIG. 2 shows a timing diagram of the control signals generated by the control circuit.

FIG. 2 shows a timing diagram of the control signals generated by the control circuit 140. In FIG. 2, when the control circuit 140 receives a start signal $SIG_{start}$, it may imply that the reference voltage $V_{ref}$ is required by the system. Therefore, when the control circuit 140 receives a start signal $SIG_{start}$, the control circuit 140 can issue the control signal $SIG_{ctr2}$ at a high voltage to the control terminal of the N-type transistor N4A. Therefore, the N-type transistor N4A would be turned on, and the protection circuit 130 can be enabled to adjust the voltage of the output terminal OUT to the operating voltage $V_{OPT}$. In FIG. 2, the voltage of the output terminal OUT would be pulled down to the operating voltage $V_{OPT}$ from the high voltage VDD. In some embodiments, the output terminal OUT may be at the high voltage VDD of 5V in the beginning, and will be pulled down to the operating voltage $V_{OPT}$ at 1.3V after the protection circuit 130 is enabled.

After the protection circuit 130 is enabled, the control circuit 140 can issue the control signal $SIG_{ctr1}$ at a high voltage to the control terminal of the N-type transistor N2A. Therefore, the N-type transistor N2A would be turned on, and the reference circuit 120 can be enabled to generate the reference voltage $V_{ref}$. Since the voltage of the output terminal OUT has been pulled down by the protection circuit 130, the reference circuit 120 can adjust the voltage of the output terminal OUT from the operation voltage $V_{OPT}$ to the reference voltage $V_{ref}$, for example but not limited to 1.2V, without suffering from the high voltage stress. Also, to ensure the accuracy of the reference voltage $V_{ref}$ generated by the reference circuit 120, the control circuit 140 can disable the protection circuit 130 simultaneously when enabling the reference circuit 120.

By enabling the protection circuit 130 before the reference circuit 120, the output terminal OUT can be discharged to a lower level by the protection circuit 130. Consequently, the hot carrier stress applied on the reference circuit 120 can be reduced, and the accuracy of the reference voltage generator 100 can be improved.

In some embodiments, since the protection circuit 130 may have to endure the high voltage stress during the discharging operation, the sizes of the N-type transistors N3A and N4A can be greater than sizes of the N-type transistors N1A and N2A for improving the stability. However, since the protection circuit 130 only needs to discharge the output terminal OUT to a rather low operation voltage $V_{OPT}$ for reducing the stress, the accuracy of the protection circuit 130 may not be critical. In this case, the sizes of the N-type transistors N3A and N4A can also be chosen to be smaller than sizes of the N-type transistors N1A and N2A for meeting the strict requirement of area.

Although the reference circuit 120 and the protection circuit 130 can be implemented by N-type transistors in FIG. 1, the reference circuit and the protection circuit may also be implemented with P-type transistors for generating a higher reference voltage in some other embodiments.

Figure 3:
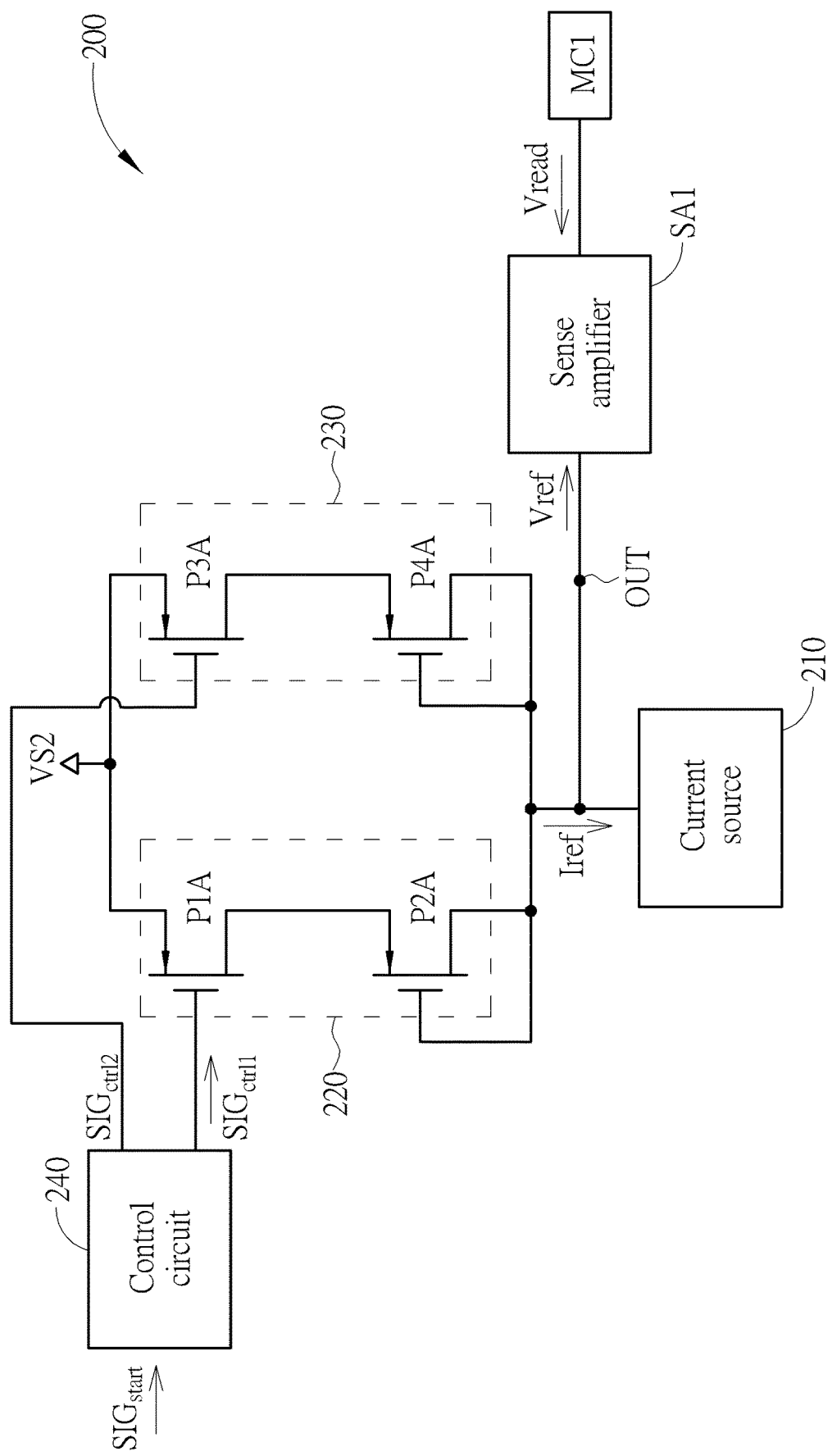
FIG. 3 shows a reference voltage generator according to another embodiment of the present invention.

FIG. 3 shows a reference voltage generator 200 according to another embodiment of the present invention. The reference voltage generator 200 and the reference voltage generator 100 have similar structures and can be operated with similar principles. However, the reference voltage generator 200 includes a current source 210, a reference circuit 220, a protection circuit 230, and a control circuit 240. Also, the reference circuit 220 and the protection circuit 230 can be implemented with P-type transistors.

In FIG. 3, the reference circuit 220 includes P-type transistor P1A and P2A. The P-type transistor P1A has a first terminal for receiving a system voltage VS2, a second terminal, and a control terminal coupled to a first output terminal of the control circuit 240. The P-type transistor P2A has a first terminal coupled to the second terminal of the P-type transistor P1A, a second terminal coupled to the output terminal OUT, and a control terminal coupled to the second terminal of the P-type transistor P2A.

Also, the protection circuit 230 includes P-type transistors P3A and P4A. The P-type transistor P3A has a first terminal for receiving the system voltage VS2, a second terminal, and a control terminal coupled to a second output terminal of the control circuit 240. The P-type transistor P4A has a first terminal coupled to the second terminal of the P-type transistor P3A, a second terminal coupled to the output terminal OUT, and a control terminal coupled to the second terminal of the P-type transistor P4A.

In some embodiments, the reference generator 200 may be used to generate a higher reference voltage $V_{ref}$, for example but not limited to 3.8V, and the system voltage VS2 can be, for example but not limited to 5V. However, since the voltage of the output terminal OUT may be pulled down to a rather low voltage during the operations, the P-type transistor P2A may endure a high voltage stress when the reference circuit 220 is enabled to generate the reference voltage $V_{ref}$.

Therefore, when the control circuit 240 receives the start signal $SIG_{start}$, the control circuit 240 may generate the control signal $SIG_{ctrl2}$ at a low voltage to turn on the P-type transistor P3A so the protection circuit 230 will be enabled first to raise the voltage of the output terminal OUT to the operation voltage $V_{OPT}$ from the low voltage, for example, the ground voltage. In some embodiments, the operation voltage $V_{OPT}$ can be, for example but not limited to 3.7V.

Consequently, later when the control circuit 240 enables the reference circuit 220, the reference circuit 220 can adjust the voltage of the output terminal OUT from the operation voltage $V_{OPT}$ to the reference voltage $V_{ref}$ without suffering from the high voltage stress.

That is, by enabling the protection circuit 230 before the reference circuit 220, the output terminal OUT can be charged to a higher level by the protection circuit 230, reducing the hot carrier stress applied on the reference circuit 220 and improving the accuracy of the reference voltage generator 200.

Also, according to the system requirement, the sizes of the P-type transistors P3A and P4A can be chosen to be greater or smaller than sizes of the P-type transistors P1A and P2A for the aforementioned reasons.

Figure 4:
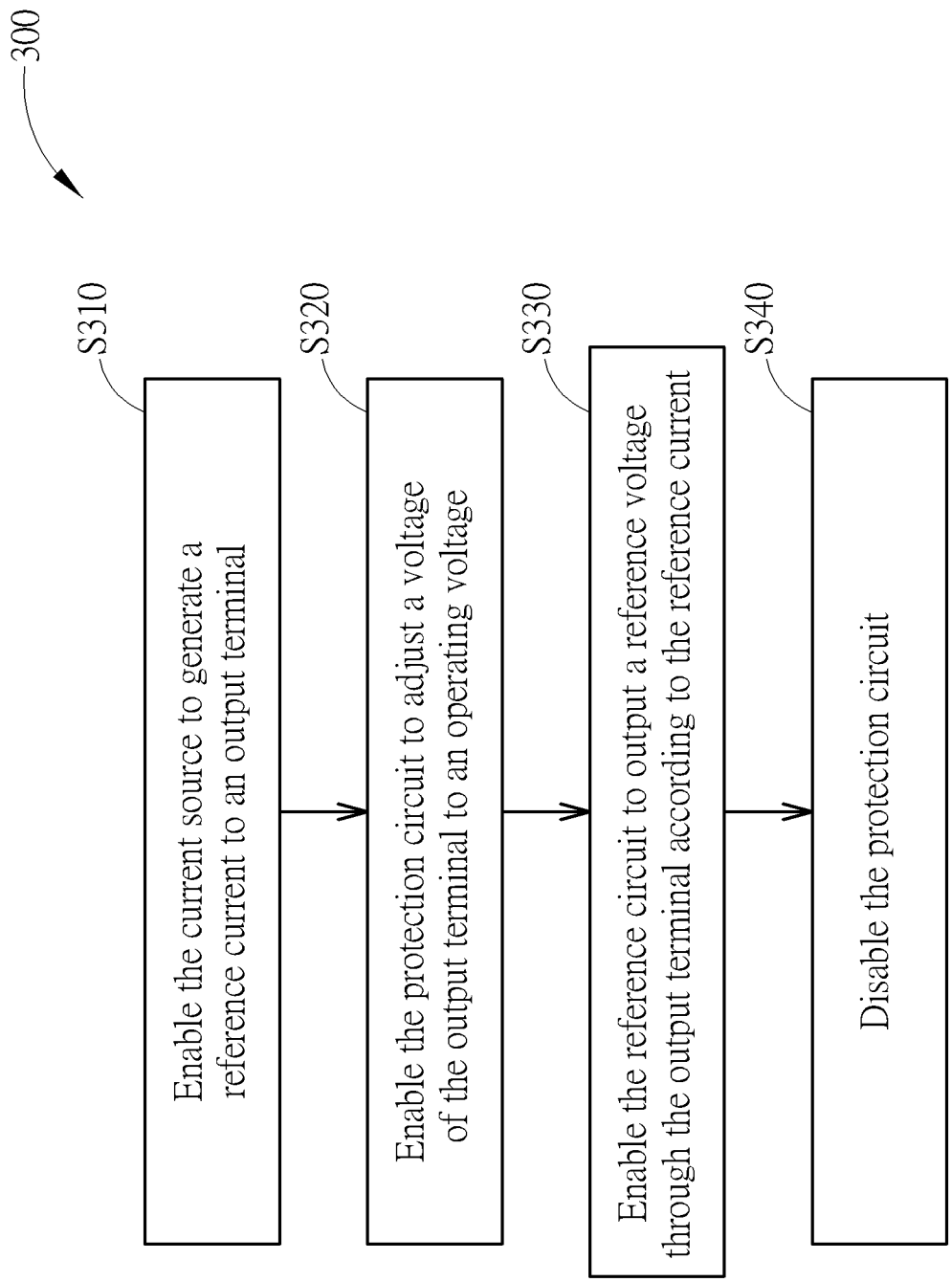
FIG. 4 shows a method for operating the reference voltage generators in FIG. 1.

FIG. 4 shows a method 300 for operating the reference voltage generators 100. The method 300 includes steps S310 to S340.

S310: enable the current source 110 to generate a reference current $I_{ref}$ to an output terminal OUT;

S320: enable the protection circuit 130 to adjust a voltage of the output terminal OUT to an operating voltage $V_{OPT}$;

S330: enable the reference circuit 120 to output a reference voltage $V_{ref}$ through the output terminal OUT according to the reference current $I_{ref}$; and S340: disable the protection circuit 130.

Also, in some embodiments, after the protection circuit 130 is enabled in step S320, steps S330 and S340 can be performed simultaneously. That is, the protection circuit 130 can be disabled as the reference circuit 120 is enabled.

In addition, in some embodiments, the method 300 can also be used to operate the reference voltage generator 200.

In summary, the reference voltage generator and the method for operating the reference voltage generator provided by the embodiments of the present invention can enable the protection circuit to adjust the voltage of the output terminal before the reference circuit is enabled; therefore, the hot carrier stress applied on the reference circuit can be reduced and the accuracy of reference voltage provided by the reference voltage generator can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A reference voltage generator comprising:
an output terminal configured to output a reference voltage;
a current source coupled to the output terminal configured to generate a reference current;
a reference circuit coupled to the output terminal, configured to generate the reference voltage according to the reference current, and comprising a first N-type transistor and a second N-type transistor;
a protection circuit coupled to the output terminal, configured to adjust a voltage of the output terminal to an operating voltage, and comprising a third N-type transistor and a fourth N-type transistor; and
a control circuit coupled to the reference circuit and the protection circuit, and configured to control the reference circuit and the protection circuit according to a start signal;
wherein:
when the control circuit receives the start signal:
the control circuit enables the protection circuit to pull down the voltage of the output terminal from a high voltage to the operating voltage; and
after the protection circuit is enabled, the control circuit enables the reference circuit to adjust the voltage of the output terminal from the operation voltage to the reference voltage, and disables the protection circuit;
the operation voltage is between the high voltage and the reference voltage;
the first N-type transistor has a first terminal coupled to the output terminal, a second terminal, and a control terminal coupled to the first terminal of the first N-type transistor;
the second N-type transistor has a first terminal coupled to the second terminal of the first N-type transistor, a second terminal configured to receive a first system voltage, and a control terminal coupled to a first output terminal of the control circuit;
the third N-type transistor has a first terminal coupled to the output terminal, a second terminal, and a control terminal coupled to the first terminal of the third N-type transistor; and
the fourth N-type transistor has a first terminal coupled to the second terminal of the third N-type transistor, a second terminal configured to receive the first system voltage, and a control terminal coupled to a second output terminal of the control circuit.

2. The reference voltage generator of claim 1, wherein sizes of the third N-type transistor and the fourth N-type transistor are smaller than sizes of the first N-type transistor and the second N-type transistor.

3. The reference voltage generator of claim 1, wherein sizes of the third N-type transistor and the fourth N-type transistor are greater than sizes of the first N-type transistor and the second N-type transistor.

4. The reference voltage generator of claim 1, wherein the output terminal is coupled to a sense amplifier configured to compare the reference voltage and a reading voltage generated by a memory cell.

* * * * *